United States Patent
Jin

(10) Patent No.: US 11,430,837 B2
(45) Date of Patent: Aug. 30, 2022

(54) FLEXIBLE TOUCH DISPLAY AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jiangjiang Jin, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 362 days.

(21) Appl. No.: 16/625,198

(22) PCT Filed: Sep. 23, 2019

(86) PCT No.: PCT/CN2019/107325
§ 371 (c)(1),
(2) Date: Dec. 20, 2019

(87) PCT Pub. No.: WO2020/248428
PCT Pub. Date: Dec. 17, 2020

(65) Prior Publication Data
US 2021/0296403 A1    Sep. 23, 2021

(30) Foreign Application Priority Data

Jun. 10, 2019   (CN) ..................... 201910494715.X

(51) Int. Cl.
*H01L 27/32* (2006.01)
*G06F 3/044* (2006.01)
(Continued)

(52) U.S. Cl.
CPC .......... *H01L 27/323* (2013.01); *G06F 3/0412* (2013.01); *G06F 3/0445* (2019.05);
(Continued)

(58) Field of Classification Search
CPC .... G06F 3/0412; G06F 3/0445; G06F 3/0446; G06F 2203/04102; H01L 27/3218;
(Continued)

(56) References Cited

U.S. PATENT DOCUMENTS

2014/0183478 A1    7/2014  Lee et al.
2019/0123112 A1*   4/2019  Lee .................... H01L 51/5284
(Continued)

FOREIGN PATENT DOCUMENTS

| CN | 106249975 A | 12/2016 |
| CN | 107092399 A | 8/2017 |

(Continued)

*Primary Examiner* — Allan R Wilson
(74) *Attorney, Agent, or Firm* — Dickinson Wright PLLC

(57) ABSTRACT

The present invention provides a flexible touch display and a display device. The flexible touch display includes a base, a light emitting portion, a first inorganic encapsulation layer, a first insulating layer, multiple first sensing electrodes, and multiple second sensing electrodes. The light emitting portion includes a pixel defining layer and multiple pixels. The first sensing electrodes are arranged spaced apart from each other on the first insulating layer. Each second sensing electrode and each first sensing electrode have a width less than or equal to a width of a bank of the pixel defining layer.

16 Claims, 3 Drawing Sheets

(51) Int. Cl.
    *G06F 3/041*    (2006.01)
    *H01L 51/52*    (2006.01)
(52) U.S. Cl.
    CPC ........ *G06F 3/0446* (2019.05); *H01L 27/3246* (2013.01); *H01L 51/5256* (2013.01); *G06F 2203/04102* (2013.01); *H01L 2251/5338* (2013.01)
(58) Field of Classification Search
    CPC ............... H01L 27/323; H01L 27/3246; H01L 51/5256; H01L 2251/5338
    See application file for complete search history.

(56) References Cited

U.S. PATENT DOCUMENTS

2019/0204952 A1* 7/2019 Han .................. G06F 3/044
2021/0232250 A1* 7/2021 Yang ................. G06F 3/047

FOREIGN PATENT DOCUMENTS

| CN | 109308141 A | 2/2019 |
| CN | 110246877 A | 9/2019 |

* cited by examiner

FLEXIBLE TOUCH DISPLAY AND DISPLAY DEVICE

FIELD OF DISCLOSURE

The present invention relates to a field of display devices and in particular, to a flexible touch display and a display device.

DESCRIPTION OF RELATED ART

Organic light-emitting diode (OLED) displays have advantages such as fast response speed, self-luminescence, high contrast, a wide temperature range, and have been widely used in display devices of various fields. Compared with other display technologies, OLEDs can be used to make flexible displays, wherein each film layer of the flexible display can be made thinner. Since a touch film of an OLED display is typically fabricated alone by a bonding process, it not only increases the complexity of a manufacturing process, but also causes the touch film to have a greater thickness. At present, there is a solution to fabricate a touch film/touch control layer directly in a manufacturing method of the OLED display, which not only reduces production costs, but also makes it easier to realize a flexible OLED touch film product. However, this way, touch sensing electrodes in the OLED touch film product are far away from a light emitting layer, so a line width of each touch sensing electrode cannot be made too large, otherwise light transmission efficiency is poor and light-emitting efficiency is lowered.

SUMMARY

Since a touch film of an OLED display is typically fabricated alone by a bonding process, it not only increases complexity of a manufacturing process, but also causes the touch film to have a greater thickness. At present, there is a solution to fabricate a touch film/touch control layer directly in a manufacturing method of the OLED display, which not only reduces production costs, but also makes it easier to realize a flexible OLED touch film product. However, this way, touch sensing electrodes in the above-mentioned OLED touch film product are far away from a light emitting layer, so a line width of each touch sensing electrode cannot be made too large, otherwise light transmission efficiency is poor and light-emitting efficiency is lowered.

It is an objective of the present invention to provide a flexible touch display and a display device, so that each first sensing electrode and each second sensing electrode are closer to a light emitting portion, thus improving touch precision and reducing difficulty in manufacturing sensing electrodes.

Accordingly, the present invention provides a flexible touch display, comprising a base, a light emitting portion, a first inorganic encapsulation layer, a first insulating layer, a plurality of first sensing electrodes, a second insulating layer, and a plurality of second sensing electrodes. The light emitting portion is disposed on the base, the light emitting portion comprises a pixel defining layer and a plurality of pixels disposed spaced apart from each other in the pixel defining layer. The first inorganic encapsulation layer is disposed on the light emitting portion. The first insulating layer is disposed on the first inorganic encapsulation layer. The first sensing electrodes are disposed spaced apart from each other on the first insulating layer. The second insulating layer is disposed on the first sensing electrodes. The second sensing electrodes are disposed on the second insulating layer and arranged corresponding to the first sensing electrodes, wherein each second sensing electrode and each first sensing electrode have a width less than or equal to a width of a bank of the pixel defining layer, and a position of each of the pixels is revealed by positions of each second sensing electrode and each first sensing electrode.

According to one embodiment of the present invention, the flexible touch display further comprises an organic and inorganic composite layer, an organic encapsulation layer, and a second inorganic encapsulation layer, wherein the organic and inorganic composite layer is disposed between the first inorganic encapsulation layer and the first insulating layer, the organic encapsulation layer is disposed on the second sensing electrodes, and the second inorganic encapsulation layer is disposed on the organic encapsulation layer.

According to one embodiment of the present invention, an organic material of the organic and inorganic composite layer comprises $Al_2O_3$, $TiO_2$, or $ZrO_2$, and an inorganic material of the organic and inorganic composite layer comprises alucone, wherein the organic and inorganic composite layer is a multilayer alternating structure.

According to one embodiment of the present invention, the organic encapsulation layer is made of one of acrylic, epoxy, silicone, and a combination thereof, the second inorganic encapsulation layer is made of $SiN_X$ or $SiON_X$, and an atomic ratio of silicon to nitrogen in the second inorganic encapsulation layer is greater than 2 to 1 (Si:N>2:1).

According to one embodiment of the present invention, the multilayer alternating structure comprises an $Al_2O_3$ layer and an alucone layer alternately stacked at least three times, and a lowest layer of the multiplayer alternating structure is one of the $Al_2O_3$ layers.

According to one embodiment of the present invention, the flexible touch display further comprises a third inorganic encapsulation layer, wherein the third encapsulation layer is disposed between the organic and inorganic composite layer and the first insulating layer, the third inorganic encapsulation layer is made of $SiN_X$ or $SiON_X$, and an atomic ratio of silicon to nitrogen in the third inorganic encapsulation layer is greater than 2 to 1 (Si:N>2:1), and each of the first sensing electrodes and each of the second sensing electrodes are made of molybdenum, silver, titanium, copper, aluminum, a molybdenum/aluminum/molybdenum composite layer, or a titanium/aluminum/titanium composite layer.

According to one embodiment of the present invention, the flexible touch display further comprises a plurality of first connection portions, a plurality of second connection portions, and a plurality of touch pads, wherein each of the first sensing electrodes is electrically connected to a corresponding one of the touch pads through a corresponding one of the first connection portions, and each of the second sensing electrodes is electrically connected to a corresponding one of the touch pads through a corresponding one of the second connection portions.

According to one embodiment of the present invention, the first insulating layer and the second insulating layer are each made of one of $SiN_X$, $SiON_X$, $SiO_X$, and a combination thereof, and an atomic ratio of silicon to nitrogen in the first insulating layer and an atomic ratio of silicon to nitrogen in the second insulating layer are both greater than 1 to 1 (Si:N>1:1).

According to one embodiment of the present invention, the base comprises a substrate and a plurality of thin film transistors (TFTs) disposed on the substrate, and each of the thin film transistors is configured to drive a corresponding one of the pixels to emit light.

The present invention further provides a display device which comprises the flexible touch display in the above-mentioned embodiment.

According to one embodiment of the present invention, the display device further comprises an organic and inorganic composite layer, an organic encapsulation layer, and a second inorganic encapsulation layer, wherein the organic and inorganic composite layer is disposed between the first inorganic encapsulation layer and the first insulating layer, the organic encapsulation layer is disposed on the second sensing electrodes, and the second inorganic encapsulation layer is disposed on the organic encapsulation layer.

According to one embodiment of the present invention, an organic material of the organic and inorganic composite layer comprises $Al_2O_3$, $TiO_2$, or $ZrO_2$, and an inorganic material of the organic and inorganic composite layer comprises alucone, wherein the organic and inorganic composite layer is a multilayer alternating structure.

According to one embodiment of the present invention, the organic encapsulation layer is made of one of acrylic, epoxy, silicone, and a combination thereof, the second inorganic encapsulation layer is made of $SiN_X$ or $SiON_X$, and an atomic ratio of silicon to nitrogen in the second inorganic encapsulation layer is greater than 2 to 1 (Si:N>2:1).

According to one embodiment of the present invention, the multilayer alternating structure comprises an $Al_2O_3$ layer and an alucone layer alternately stacked at least three times, and a lowest layer of the multiplayer alternating structure is one of the $Al_2O_3$ layers.

According to one embodiment of the present invention, the display device further comprises a third inorganic encapsulation layer, wherein the third encapsulation layer is disposed between the organic and inorganic composite layer and the first insulating layer, the third inorganic encapsulation layer is made of $SiN_X$ or $SiON_X$, and an atomic ratio of silicon to nitrogen in the third inorganic encapsulation layer is greater than 2 to 1(Si:N>2:1), and each of the first sensing electrodes and each of the second sensing electrodes are made of molybdenum, silver, titanium, copper, aluminum, a molybdenum/aluminum/molybdenum composite layer, or a titanium/aluminum/titanium composite layer.

According to one embodiment of the present invention, the display device further comprises a plurality of first connection portions, a plurality of second connection portions, and a plurality of touch pads, wherein each of the first sensing electrodes is electrically connected to a corresponding one of the touch pads through a corresponding one of the first connection portions, and each of the second sensing electrodes is electrically connected to a corresponding one of the touch pads through a corresponding one of the second connection portions.

According to one embodiment of the present invention, the first insulating layer and the second insulating layer are each made of one of $SiN_X$, $SiON_X$, $SiO_X$, and a combination thereof, and an atomic ratio of silicon to nitrogen in the first insulating layer and an atomic ratio of silicon to nitrogen in the second insulating layer are both greater than 1 to 1(Si:N>1:1).

According to one embodiment of the present invention, the base comprises a substrate and a plurality of thin film transistors (TFTs) disposed on the substrate, and each of the thin film transistors is configured to drive a corresponding one of the pixels to emit light.

The present invention also has following functions. The present invention provides a flexible touch display with high reliability and efficiency. The first sensing electrodes and the second sensing electrodes are directly formed in thin film encapsulation structures (touch-in-TFE), so that each of the first sensing electrodes and each of the second sensing electrodes are closer to the light emitting portion in a vertical direction, thereby improving touch precision. Further, by increasing the width of each of the first sensing electrodes and the second sensing electrodes, difficulty in manufacturing of the sensing electrodes is reduced (that is, manufacturing becomes easy), production costs can be reduced, and optical interference of the sensing electrodes is reduced, and light transmission efficiency is improved.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work.

DETAILED DESCRIPTION OF EMBODIMENTS

References to "embodiment" in the detailed description mean that the specific features, structures, or characteristics described in connection with the embodiment may be included in at least one embodiment of the present invention. The same terms appearing in different places in the specification are not necessarily limited to the same embodiment, but should be understood as independent or alternative embodiments to other embodiments. In view of the technical solutions disclosed in the embodiments of the present invention, those skilled in the art should understand that the embodiments described herein may have other combinations or modifications in accordance with the embodiments of the present invention.

Figure 1:
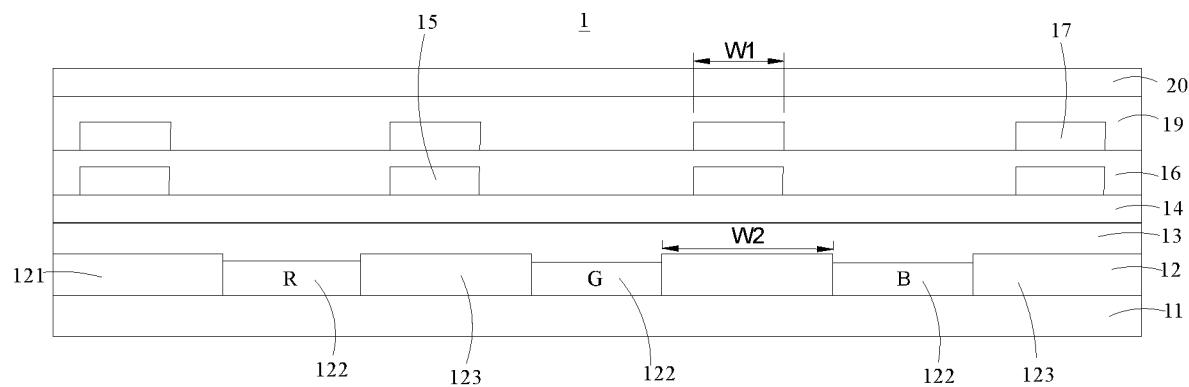
FIG. 1 is a cross-sectional view illustrating a flexible touch display and a display device according to one embodiment of the present invention.

Please refer to FIG. 1. The present invention provides a flexible touch display 1. The flexible touch display 1 comprises a base 11, a light emitting portion 12, a first inorganic encapsulation layer 13, a first insulating layer 14, a plurality of first sensing electrodes 15, and a plurality of second sensing electrodes 17. The light emitting portion 12 is disposed on the base 11. The light emitting portion 12 comprises a pixel defining layer 121 and a plurality of pixels 122 disposed spaced apart from each other in the pixel defining layer 121. In the embodiment shown in FIG. 1, each of the pixels 122 is made of an organic material for implementing a self-emissive display technology. The pixels 122 are, for example, red (R), green (G), and blue (B) pixels. The flexible touch display 1 of the present embodiment is preferably a flexible touch organic light-emitting diode (OLED) display.

The first inorganic encapsulation layer 13 is disposed on the light emitting portion 12. The first insulating layer 14 is disposed on the first inorganic encapsulation layer 13. The first sensing electrodes 15 are disposed spaced apart from each other on the first insulating layer 14. The second insulating layer 16 is disposed on the first sensing electrodes 15. The second sensing electrodes 17 are disposed on the second insulating layer 16 and arranged corresponding to the first sensing electrodes 15. Each second sensing electrode 17 and each first sensing electrode 15 have a width W1 less than a width W2 of a bank 123 of the pixel defining layer 121. A position of each of the pixels 122 is revealed by positions of each second sensing electrode 17 and each first sensing electrode 15, so that light of each pixel 122 can penetrate each of the second sensing electrodes 17 and each of the first sensing electrodes 15 to increase light transmission efficiency. In alternative embodiments, the width W1 of each second sensing electrode 17 and each first sensing electrode 15 is equal to the width W2 of the bank 123 of the pixel defining layer 121; however, configuration may vary as required.

Figure 2:
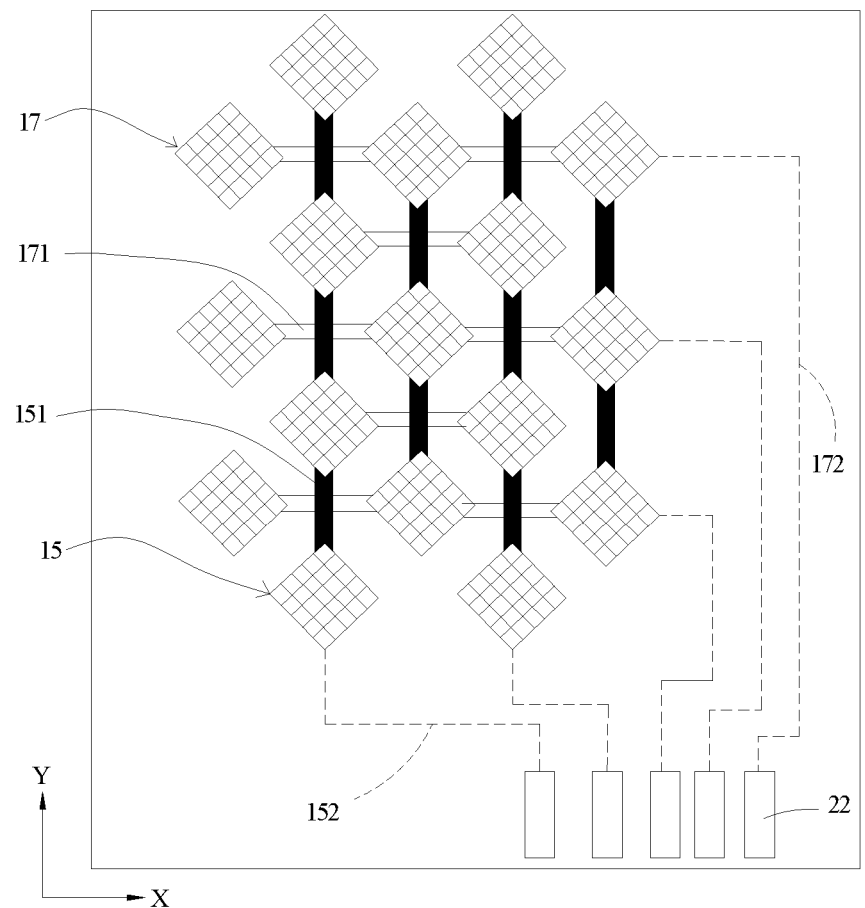
FIG. 2 is a schematic planar view illustrating the flexible touch display and the display device according to one embodiment of the present invention.

Also referring to FIG. 2, the flexible touch display 1 further comprises a plurality of first connection portions 151, a plurality of second connection portions 171, and a plurality of touch pads 22. The first sensing electrodes 15 are arrayed along a first direction Y and electrically connected to each other through the first connection portions 151. Each of the first sensing electrodes 15 is electrically connected to a corresponding one of the touch pads 22 through a corresponding one of first connection lines 152. The second sensing electrodes 17 are arrayed along a second direction X and electrically connected to each other through the second connection portions 171. Each of the second sensing electrodes 17 is electrically connected to a corresponding one of the touch pads through a corresponding one of second connection lines 172. The first connection portions 151 and the second connection portions 171 can be metal lines. Each of the first sensing electrodes 15 and each of the second sensing electrodes 17 are made of molybdenum, silver, titanium, copper, aluminum, a molybdenum/aluminum/molybdenum composite layer, or a titanium/aluminum/titanium composite layer. The first sensing electrodes 15 and the second sensing electrodes 17 are conventional techniques, so a detailed description is not repeated herein for brevity.

Figure 3:
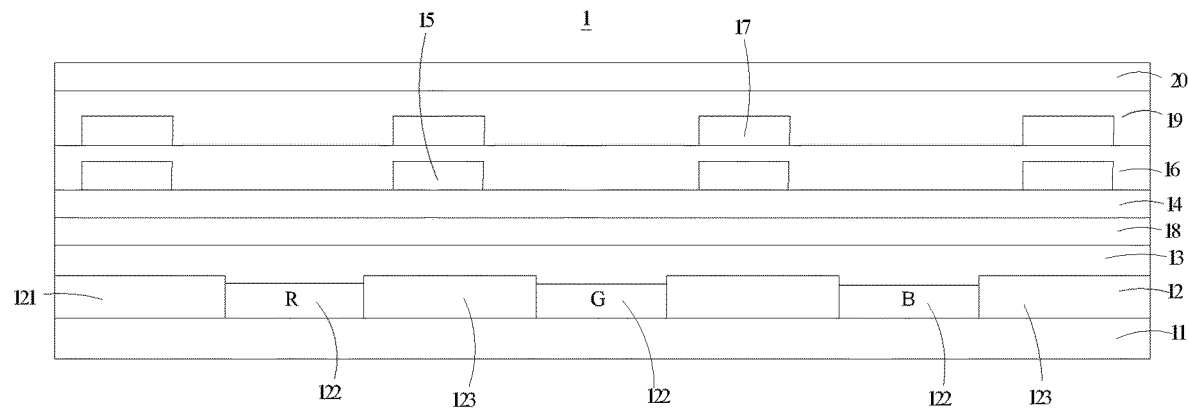
FIG. 3 is another cross-sectional view illustrating the flexible touch display and the display device according to one embodiment of the present invention.

Referring to FIG. 3, the flexible touch display 1 further comprises an organic and inorganic composite layer 18, an organic encapsulation layer 19, and a second inorganic encapsulation layer 20. The organic and inorganic composite layer 18 is disposed between the first inorganic encapsulation layer 13 and the first insulating layer 14. The organic encapsulation layer 19 is disposed on the second sensing electrodes 17, and the second inorganic encapsulation layer 20 is disposed on the organic encapsulation layer 19.

An organic material of the organic and inorganic composite layer 18 comprises $Al_2O_3$, $TiO_2$, or $ZrO_2$, and an inorganic material of the organic and inorganic composite layer 18 comprises alucone made by, for example, reacting trimethyl (TMA) with ethylene glycol (EG). The organic and inorganic composite layer 18 is a multilayer alternating structure.

Figure 4:
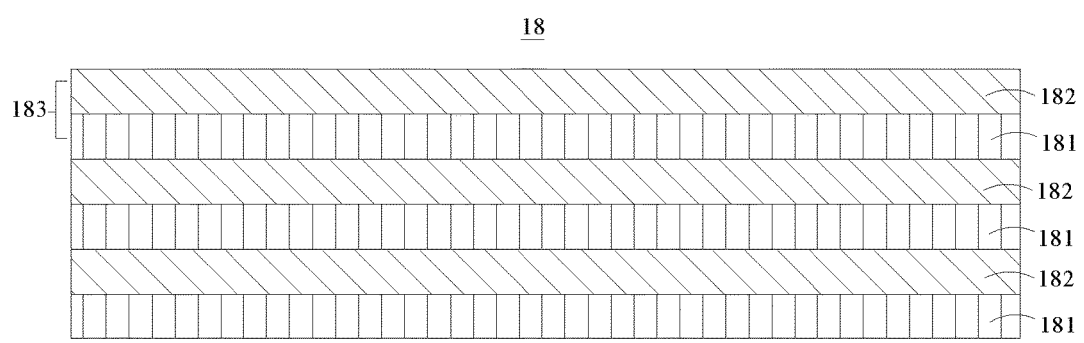
FIG. 4 is a cross-sectional view illustrating an organic and inorganic composite layer of FIG. 3.

As shown in FIG. 4, the multilayer alternating structure comprises an $Al_2O_3$ layer 181 and an alucone layer 182 alternately stacked at least three times, and a lowest layer of the multiplayer alternating structure is one of the $Al_2O_3$ layers 181. In other words, the multiplayer alternating structure comprises at least three stacked layer structures 183, and each stacked layer structure 183 having one of the $Al_2O_3$ layer 181 paired with one of the alucone layers 182. Therefore, by using the multilayer alternating structure of the present embodiment, a composite thin film packaging structure having excellent flexibility and water/oxygen barrier properties can be obtained.

Figure 5:
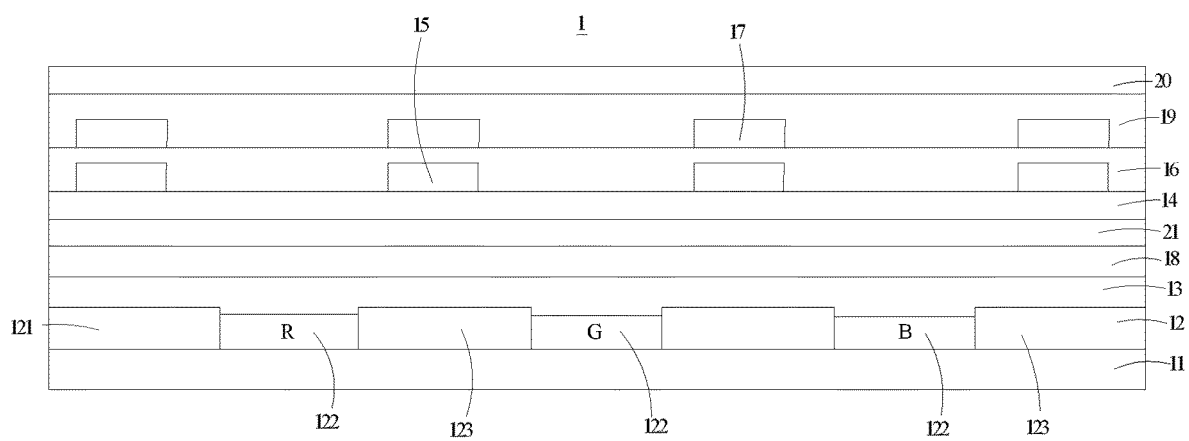
FIG. 5 is still another cross-sectional view illustrating the flexible touch display and the display device according to one embodiment of the present invention.

The organic encapsulation layer 19 is made of one of acrylic, epoxy, silicone, and a combination thereof. The second inorganic encapsulation layer 20 is made of $SiN_X$ or $SiON_X$, and an atomic ratio of silicon to nitrogen in the second inorganic encapsulation layer 20 is greater than 2 to 1 (Si:N>2:1). When the atomic ratio of silicon to nitrogen is higher, water/oxygen barrier properties and corrosion resistance properties are better. Please also refer to FIG. 5. The flexible touch display 1 further comprises a third inorganic encapsulation layer 21, wherein the third encapsulation layer 21 is disposed between the organic and inorganic composite layer 18 and the first insulating layer 14, the third inorganic encapsulation layer 21 is made of $SiN_X$ or $SiON_X$, and an atomic ratio of silicon to nitrogen in the third inorganic encapsulation layer 21 is greater than 2 to 1 (Si:N>2:1). When the atomic ratio of silicon to nitrogen is higher, water/oxygen barrier properties and corrosion resistance properties are better. Accordingly, the embodiment of FIG. 5 has better barrier properties than the embodiment of FIG. 3.

It should be noted that, the first insulating layer 14 and the second insulating layer 16 are each made of one of $SiN_X$, $SiON_X$, $SiO_X$, and a combination thereof An atomic ratio of silicon to nitrogen in the first insulating layer 14 and an atomic ratio of silicon to nitrogen in the second insulating layer 16 are both greater than 1 to 1 (Si:N>1:1). When the atomic ratio of silicon to nitrogen is higher, water/oxygen barrier properties and corrosion resistance properties are better. The base 11 comprises a substrate (not illustrated) and a plurality of thin film transistors (not illustrated) disposed on the substrate. Each of thin film transistors is configured to drive a corresponding one of the pixels 122 to emit light.

In the embodiment of the present invention, the first sensing electrodes 15 and the second sensing electrodes 17 are directly formed in a thin film encapsulation structure such as the second insulating layer 16 and the organic encapsulating layer 19, so that each of the first sensing electrodes 15 and each of the second sensing electrodes 17 are closer to the light emitting portion 12 in a vertical direction, improving touch precision. Further, by increasing the line width W1 of each of the first sensing electrodes 15 and the second sensing electrodes 17, difficulty in manufacturing of the sensing electrodes 15 and 17 is reduced (that is, manufacturing becomes easy), production costs can be reduced, and optical interference of the sensing electrodes 15, 17 is reduced, and light transmission efficiency is improved.

Furthermore, according to one embodiment of the present invention, a display device is provided. The display device is, for example, the flexible touch display 1 described in the foregoing embodiments. The display device includes, but is not limited to, a smart phone, a television (TV), a tablet computer, a notebook computer, an in-vehicle display, a wearable device, or other suitable flexible touch display. For details about the structure, manufacturing method and related materials of the flexible touch display 1, please refer to the above embodiments, so a detailed description is omitted herein for brevity.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A flexible touch display, comprising:
a base;
a light emitting portion disposed on the base, the light emitting portion comprising a pixel defining layer and a plurality of pixels disposed spaced apart from each other in the pixel defining layer;
a first inorganic encapsulation layer disposed on the light emitting portion;
a first insulating layer disposed on the first inorganic encapsulation layer;
an organic and inorganic composite layer disposed between the first inorganic encapsulation layer and the first insulating layer;
a plurality of first sensing electrodes disposed spaced apart from each other on the first insulating layer;
a second insulating layer disposed on the first sensing electrodes;
a plurality of second sensing electrodes disposed on the second insulating layer and arranged corresponding to the first sensing electrodes;
an organic encapsulation layer disposed on the second sensing electrodes; and
a second inorganic encapsulation layer disposed on the organic encapsulation layer, wherein each second sensing electrode and each first sensing electrode have a width less than or equal to a width of a bank of the pixel defining layer, and a position of each of the pixels is revealed by positions of each second sensing electrode and each first sensing electrode.

2. The flexible touch display according to claim 1, wherein an organic material of the organic and inorganic composite layer comprises $Al_2O_3$, $TiO_2$, or $ZrO_2$, and an inorganic material of the organic and inorganic composite layer comprises alucone, wherein the organic and inorganic composite layer is a multilayer alternating structure.

3. The flexible touch display according to claim 1, wherein the organic encapsulation layer is made of one of acrylic, epoxy, silicone, and a combination thereof, the second inorganic encapsulation layer is made of $SiN_X$ or $SiON_X$, and an atomic ratio of silicon to nitrogen in the second inorganic encapsulation layer is greater than 2 to 1.

4. The flexible touch display according to claim 2, wherein the multilayer alternating structure comprises an $Al_2O_3$ layer and an alucone layer alternately stacked at least three times, and a lowest layer of the multiplayer alternating structure is one of the $Al_2O_3$ layers.

5. The flexible touch display according to claim 1, further comprising a third inorganic encapsulation layer, wherein the third encapsulation layer is disposed between the organic and inorganic composite layer and the first insulating layer, the third inorganic encapsulation layer is made of $SiN_X$ or $SiON_X$, and an atomic ratio of silicon to nitrogen in the third inorganic encapsulation layer is greater than 2 to 1, and each of the first sensing electrodes and each of the second sensing electrodes are made of molybdenum, silver, titanium, copper, aluminum, a molybdenum/aluminum/molybdenum composite layer, or a titanium/aluminum/titanium composite layer.

6. The flexible touch display according to claim 1, further comprising a plurality of first connection portions, a plurality of second connection portions, and a plurality of touch pads, wherein each of the first sensing electrodes is electrically connected to a corresponding one of the touch pads through a corresponding one of the first connection portions, and each of the second sensing electrodes is electrically connected to a corresponding one of the touch pads through a corresponding one of the second connection portions.

7. The flexible touch display according to claim 1, wherein the first insulating layer and the second insulating layer are each made of one of $SiN_X$, $SiON_X$, $SiO_X$, and a combination thereof, and an atomic ratio of silicon to nitrogen in the first insulating layer and an atomic ratio of silicon to nitrogen in the second insulating layer are both greater than 1 to 1.

8. The flexible touch display according to claim 1, wherein the base comprises a substrate and a plurality of thin film transistors disposed on the substrate, and each of the thin film transistors is configured to drive each of the pixels to emit light.

9. A display device, comprising:
a flexible touch display, comprising:
a base;
a light emitting portion disposed on the base, the light emitting portion comprising a pixel defining layer and a plurality of pixels disposed spaced apart from each other in the pixel defining layer;
a first inorganic encapsulation layer disposed on the light emitting portion;
a first insulating layer disposed on the first inorganic encapsulation layer;
an organic and inorganic composite layer disposed between the first inorganic encapsulation layer and the first insulating layer;
a plurality of first sensing electrodes, the first sensing electrodes disposed spaced apart from each other on the first insulating layer;
a second insulating layer disposed on the first sensing electrodes;
a plurality of second sensing electrodes disposed on the second insulating layer and arranged corresponding to the first sensing electrodes;
an organic encapsulation layer disposed on the second sensing electrodes; and
a second inorganic encapsulation layer disposed on the organic encapsulation layer, wherein each second sensing electrode and each first sensing electrode have a width less than or equal to a width of a bank of the pixel defining layer, and a position of each of the pixels is revealed by positions of each second sensing electrode and each first sensing electrode.

10. The display device according to claim 9, wherein an organic material of the organic and inorganic composite layer comprises $Al_2O_3$, $TiO_2$, or $ZrO_2$, and an inorganic material of the organic and inorganic composite layer comprises alucone, wherein the organic and inorganic composite layer is a multilayer alternating structure.

11. The display device according to claim 9, wherein the organic encapsulation layer is made of one of acrylic, epoxy, silicone, and a combination thereof, the second inorganic encapsulation layer is made of $SiN_X$ or $SiON_X$, and an atomic ratio of silicon to nitrogen in the second inorganic encapsulation layer is greater than 2 to 1.

12. The display device according to claim 10, wherein the multilayer alternating structure comprises an $Al_2O_3$ layer and an alucone layer alternately stacked at least three times, and a lowest layer of the multiplayer alternating structure is one of the $Al_2O_3$ layers.

13. The display device according to claim 9, further comprising a third inorganic encapsulation layer, wherein the third encapsulation layer is disposed between the organic and inorganic composite layer and the first insulating layer, the third inorganic encapsulation layer is made of $SiN_X$ or $SiON_X$, and an atomic ratio of silicon to nitrogen in the third inorganic encapsulation layer is greater than 2 to 1, and each of the first sensing electrodes and each of the second sensing electrodes are made of molybdenum, silver, titanium, copper, aluminum, a molybdenum/aluminum/molybdenum composite layer, or a titanium/aluminum/titanium composite layer.

14. The display device according to claim 9, further comprising a plurality of first connection portions, a plurality of second connection portions, and a plurality of touch pads, wherein each of the first sensing electrodes is electrically connected to a corresponding one of the touch pads through a corresponding one of the first connection portions, and each of the second sensing electrodes is electrically connected to a corresponding one of the touch pads through a corresponding one of the second connection portions.

15. The flexible touch display according to claim 9, wherein the first insulating layer and the second insulating layer are each made of one of $SiN_X$, $SiON_X$, $SiO_X$, and a combination thereof, and an atomic ratio of silicon to nitrogen in the first insulating layer and an atomic ratio of silicon to nitrogen in the second insulating layer are both greater than 1 to 1.

16. The display device of claim 15, wherein the electronic elements comprise a light sensor.

* * * * *